(12) United States Patent
Park et al.

(10) Patent No.: US 7,989,365 B2
(45) Date of Patent: Aug. 2, 2011

(54) REMOTE PLASMA SOURCE SEASONING

(75) Inventors: Soonam Park, Mountain View, CA (US); Soo Jeon, San Jose, CA (US); Toan Q. Tran, San Jose, CA (US); Jang-Gyoo Yang, San Jose, CA (US); Qiwei Liang, Fremont, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 65 days.

(21) Appl. No.: 12/543,245

(22) Filed: Aug. 18, 2009

(65) Prior Publication Data

US 2011/0045676 A1 Feb. 24, 2011

(51) Int. Cl.
*H01L 21/316* (2006.01)

(52) U.S. Cl. . 438/788; 438/792; 438/905; 257/E21.278; 427/574

(58) Field of Classification Search .......... 438/787, 438/788, 792, 905; 257/E21.278; 427/574; 134/1.1
See application file for complete search history.

(56) References Cited

U.S. PATENT DOCUMENTS

| | | | |
|---|---|---|---|
| 4,147,571 A | 4/1979 | Stringfellow et al. |
| 4,816,098 A | 3/1989 | Davis et al. |
| 4,818,326 A | 4/1989 | Liu et al. |
| 4,931,354 A | 6/1990 | Wakino et al. |
| 5,016,332 A | 5/1991 | Reichelderfer et al. |
| 5,110,407 A | 5/1992 | Ono et al. |
| 5,393,708 A | 2/1995 | Hsia et al. |
| 5,426,076 A | 6/1995 | Moghadam |
| 5,558,717 A | 9/1996 | Zhao et al. |
| 5,587,014 A | 12/1996 | Leychika et al. |
| 5,622,784 A | 4/1997 | Okaue et al. |
| 5,635,409 A | 6/1997 | Moslehi |
| 5,691,009 A | 11/1997 | Sandhu |
| 5,786,263 A | 7/1998 | Perera |
| 5,853,607 A | 12/1998 | Zhao et al. |
| 5,937,308 A | 8/1999 | Gardner et al. |
| 5,937,323 A | 8/1999 | Orczyk et al. |
| 6,008,515 A | 12/1999 | Hsia et al. |
| 6,009,830 A | 1/2000 | Li et al. |

(Continued)

FOREIGN PATENT DOCUMENTS

DE 19654737 A1 7/1997

(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner* — Tuan N. Quach
(74) *Attorney, Agent, or Firm* — Kilpatrick Townsend & Stockton LLP

(57) ABSTRACT

Methods of seasoning a remote plasma system are described. The methods include the steps of flowing a silicon-containing precursor into a remote plasma region to deposit a silicon containing film on an interior surface of the remote plasma system. The methods reduce reactions with the seasoned walls during deposition processes, resulting in improved deposition rate, improved deposition uniformity and reduced defectivity during subsequent deposition.

23 Claims, 8 Drawing Sheets

U.S. PATENT DOCUMENTS

| | | | |
|---|---|---|---|
| 6,024,044 A | 2/2000 | Law et al. |
| 6,087,243 A | 7/2000 | Wang |
| 6,090,723 A | 7/2000 | Thakur et al. |
| 6,140,242 A | 10/2000 | Oh et al. |
| 6,146,970 A | 11/2000 | Witek et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,207,587 B1 | 3/2001 | Li et al. |
| 6,287,962 B1 | 9/2001 | Lin |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,448,187 B2 | 9/2002 | Yau et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,589,868 B2 * | 7/2003 | Rossman ............. 438/680 |
| 6,596,654 B1 | 7/2003 | Bayman et al. |
| 6,614,181 B1 | 9/2003 | Harvey et al. |
| 6,624,064 B1 * | 9/2003 | Sahin et al. ............. 438/627 |
| 6,630,413 B2 | 10/2003 | Todd |
| 6,645,303 B2 * | 11/2003 | Frankel et al. ............. 118/725 |
| 6,660,391 B1 | 12/2003 | Rose et al. |
| 6,676,751 B2 | 1/2004 | Solomon et al. |
| 6,683,364 B2 | 1/2004 | Oh et al. |
| 6,716,770 B2 | 4/2004 | O'Neill et al. |
| 6,756,085 B2 | 6/2004 | Waldfried et al. |
| 6,787,191 B2 | 9/2004 | Hanahata et al. |
| 6,794,290 B1 | 9/2004 | Papasouliotis et al. |
| 6,818,517 B1 | 11/2004 | Maes |
| 6,819,886 B2 * | 11/2004 | Runkowske et al. ............ 399/38 |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 * | 12/2004 | Selbrede et al. ......... 156/345.35 |
| 6,858,523 B2 | 2/2005 | Deboer et al. |
| 6,867,086 B1 | 3/2005 | Chen et al. |
| 6,872,323 B1 * | 3/2005 | Entley et al. ............. 216/67 |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,084,076 B2 | 8/2006 | Park et al. |
| 7,109,114 B2 * | 9/2006 | Chen et al. .................... 438/680 |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,183,177 B2 * | 2/2007 | Al-Bayati et al. ............ 438/458 |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,524,735 B1 | 4/2009 | Gauri et al. |
| 7,524,750 B2 * | 4/2009 | Nemani et al. ................ 438/597 |
| 7,541,297 B2 | 6/2009 | Mallick et al. |
| 7,745,352 B2 | 6/2010 | Mallick et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 2001/0021595 A1 | 9/2001 | Jang et al. |
| 2001/0029114 A1 | 10/2001 | Vulpio et al. |
| 2001/0038919 A1 | 11/2001 | Berry et al. |
| 2001/0054387 A1 | 12/2001 | Frankel et al. |
| 2002/0048969 A1 | 4/2002 | Suzuki et al. |
| 2002/0081817 A1 | 6/2002 | Bhakta et al. |
| 2002/0127350 A1 | 9/2002 | Ishikawa et al. |
| 2002/0142585 A1 | 10/2002 | Mandal |
| 2002/0146879 A1 | 10/2002 | Fu et al. |
| 2002/0164891 A1 | 11/2002 | Gates et al. |
| 2003/0040199 A1 | 2/2003 | Agarwal |
| 2003/0064154 A1 | 4/2003 | Laxman et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0199151 A1 | 10/2003 | Ho et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0219780 A1 | 11/2004 | Ohuchi |
| 2004/0241342 A1 | 12/2004 | Karim et al. |
| 2005/0001556 A1 | 1/2005 | Hoffman et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0227499 A1 | 10/2005 | Park et al. |
| 2005/0250340 A1 | 11/2005 | Chen et al. |
| 2006/0011984 A1 | 1/2006 | Currie |
| 2006/0014399 A1 | 1/2006 | Joe |
| 2006/0030165 A1 | 2/2006 | Ingle et al. |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0096540 A1 | 5/2006 | Choi |
| 2006/0110943 A1 | 5/2006 | Swerts et al. |
| 2006/0121394 A1 | 6/2006 | Chi |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0281496 A1 | 12/2006 | Cedraeus |
| 2006/0286776 A1 | 12/2006 | Ranish et al. |
| 2007/0020392 A1 | 1/2007 | Kobrin et al. |
| 2007/0026689 A1 | 2/2007 | Nakata et al. |
| 2007/0049044 A1 | 3/2007 | Marsh |
| 2007/0077777 A1 | 4/2007 | Gumpher |
| 2007/0092661 A1 | 4/2007 | Ryuzaki et al. |
| 2007/0128864 A1 | 6/2007 | Ma et al. |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281495 A1 | 12/2007 | Mallick et al. |
| 2007/0281496 A1 | 12/2007 | Ingle et al. |
| 2008/0000423 A1 * | 1/2008 | Fukiage ................ 118/712 |
| 2008/0085607 A1 | 4/2008 | Yu et al. |

| | | | |
|---|---|---|---|
| 2008/0102223 | A1 | 5/2008 | Wagner et al. |
| 2008/0102650 | A1 | 5/2008 | Adams et al. |
| 2008/0188087 | A1* | 8/2008 | Chen et al. ............ 438/758 |
| 2008/0318429 | A1* | 12/2008 | Ozawa et al. ............ 438/695 |
| 2009/0061647 | A1 | 3/2009 | Mallick et al. |
| 2009/0104755 | A1 | 4/2009 | Mallick et al. |
| 2009/0104790 | A1 | 4/2009 | Liang |
| 2009/0325391 | A1 | 12/2009 | De Vusser et al. |
| 2010/0221925 | A1 | 9/2010 | Lee et al. |
| 2011/0014798 | A1 | 1/2011 | Mallick et al. |
| 2011/0034035 | A1 | 2/2011 | Liang et al. |
| 2011/0034039 | A1 | 2/2011 | Liang et al. |
| 2011/0111137 | A1 | 5/2011 | Liang et al. |

FOREIGN PATENT DOCUMENTS

| | | |
|---|---|---|
| EP | 0892083 A1 | 1/1999 |
| EP | 1717848 A | 11/2006 |
| JP | 01241826 A | 9/1989 |
| KR | 10-2004-0091978 A | 11/2004 |
| KR | 10-2005-0003758 A | 1/2005 |
| KR | 10-2005-0094183 A | 9/2005 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH, vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Tsu, D. V. et al., "Silicon Nitride and Silicon Diimide Grown By Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Aylett, B. J. et al., "Silicon-Nitrogen Compounds. Part V. Diphenylamino-derivatives of Silane," J. Chem. Soc. (A), 1969, pp. 636-638.

Aylett, B. J. et al., "Silicon-Nitrogen Compounds. Part VI.[1] The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

* cited by examiner

REMOTE PLASMA SOURCE SEASONING

CROSS-REFERENCES TO RELATED APPLICATIONS

This application is related to U.S. patent application Ser. No. 12/210,982, filed Sep. 15, 2008, and titled "FLOWABLE DIELECTRIC GAPFILL EQUIPMENT AND PROCESSES." This application is also related to U.S. patent application Ser. No. 11/754,858, filed May 29, 2007, abandoned, and titled "PROCESS CHAMBER FOR DIELECTRIC GAPFILL." The entire contents of both applications are herein incorporated by reference for all purposes.

FIELD

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND

Processing steps used in the semiconductor industry include depositing and etching films on a substrate. Dielectric films are deposited into complex topologies during some processing steps often to provide physical and electrical separation between conductive or semiconductive regions.

Many techniques have been developed to deposit dielectrics into narrow gaps including chemical vapor deposition techniques which sometimes employ plasma excitation. High-density plasma (HDP)-CVD has been used to fill many geometries due to the perpendicular impingement trajectories of the incoming reactants and the simultaneous sputtering activity. Some very narrow gaps have continued to develop voids due, in part, to the lack of mobility following initial impact. Reflowing the material after deposition can fill the void but, if the dielectric has a high reflow temperature (like $SiO_2$), the reflow process may also consume a non-negligible portion of a wafer's thermal budget.

By way of its high surface mobility, flowable materials such as spin-on glass (SOG) have been useful in filling some of the gaps which were incompletely filled by HDP-CVD. SOG is applied as a liquid and cured after application to remove solvents, thereby converting material to a solid glass film. The gap-filling (gapfill) and planarization capabilities are enhanced for SOG when the viscosity is low. Unfortunately, low viscosity materials may shrink significantly during cure. Significant film shrinkage results in high film stress and delamination issues, especially for thick films.

Separating the delivery paths of two components can produce a flowable film during deposition on a substrate surface. FIG. 1 shows a schematic of a substrate processing system with a substrate 115 supported on a pedestal 110 affixed to a pedestal shaft 105. The substrate processing system has separated precursor delivery channels 125 and 135. An organosilane precursor may be delivered through one channel and an oxidizing precursor may be delivered through the other. The oxidizing precursor may be excited by a remote plasma 145 unit. The mixing region 120 of the two components occurs closer to the substrate 115 than alternative processes utilizing a more common delivery path. Since the films are grown rather than poured onto the surface, the organic components needed to decrease viscosity are allowed to evaporate during the process which reduces the shrinkage affiliated with a cure step. Growing films this way limits the time available for adsorbed species to remain mobile, a constraint which may result in deposition of nonuniform films. A baffle 140 or a showerhead (not pictured) may be used to more evenly distribute the precursors in the reaction region.

Gapfill capabilities and deposition uniformity benefit from high surface mobility which may be enabled by plasma excited oxygen radicals introduced from remote plasma unit 145. Precautions may be necessary to ensure that production of plasma excited oxidizer is sufficient and predictable.

BRIEF SUMMARY

Methods of seasoning a remote plasma system are described. The methods include the steps of flowing a silicon-containing precursor into a remote plasma region to deposit a silicon containing film on an interior surface of the remote plasma system. The methods reduce reactions with the seasoned walls during deposition processes, resulting in improved deposition rate, improved deposition uniformity and reduced defectivity during subsequent deposition.

Embodiments of the invention include methods of forming a silicon-containing layer on a surface of a substrate within a processing region. The methods include cleaning an interior surface of a remote plasma region by flowing a cleaning gas into the remote plasma region and forming a cleaning plasma in the remote plasma region. The methods further include treating the interior surface by flowing a first silicon-containing precursor into the remote plasma region and forming a treatment plasma in the remote plasma region to deposit a protective silicon-containing film on the interior surface.

Further embodiments of the invention include methods of treating an aluminum-containing interior surface of a remote plasma source prior to depositing a silicon-containing layer on a substrate within a processing region. The methods include flowing a halogen-containing gas into the remote plasma region; forming a cleaning plasma in the remote plasma region which results in exposed portions of the aluminum-containing interior surface; flowing a first silicon-containing precursor into the remote plasma region; and forming a treatment plasma in the remote plasma region to deposit a silicon-containing film on the aluminum-containing interior surface.

Further embodiments of the invention include methods of forming a silicon oxide layer on the surface of a substrate within a processing region. The methods include cleaning an interior surface of a plasma region by flowing a cleaning gas into the plasma region and forming a cleaning plasma in the plasma region. The methods further include seasoning the interior surface of the plasma region by flowing a first silicon-containing precursor into the plasma region and forming a seasoning plasma in the plasma region to deposit a protective silicon-containing film on the interior surface. The methods further include depositing the silicon oxide layer on the substrate by flowing an oxygen-containing precursor into the plasma region, forming a deposition plasma in the plasma region, flowing deposition plasma effluents into the processing region, flowing a second silicon-containing precursor into the processing region, and forming the silicon oxide film from the deposition plasma effluents and the second silicon-containing precursor.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Where the reference label is used in the specification, the description is applicable to any one of the similar components having the same reference label.

DETAILED DESCRIPTION

Methods of seasoning a remote plasma system are described. The methods include the steps of flowing a silicon-containing precursor into a remote plasma region to deposit a silicon containing film on an interior surface of the remote plasma system. The methods reduce reactions with the seasoned walls during deposition processes, resulting in improved deposition rate, improved deposition uniformity and reduced defectivity during subsequent deposition.

Figure 2A:
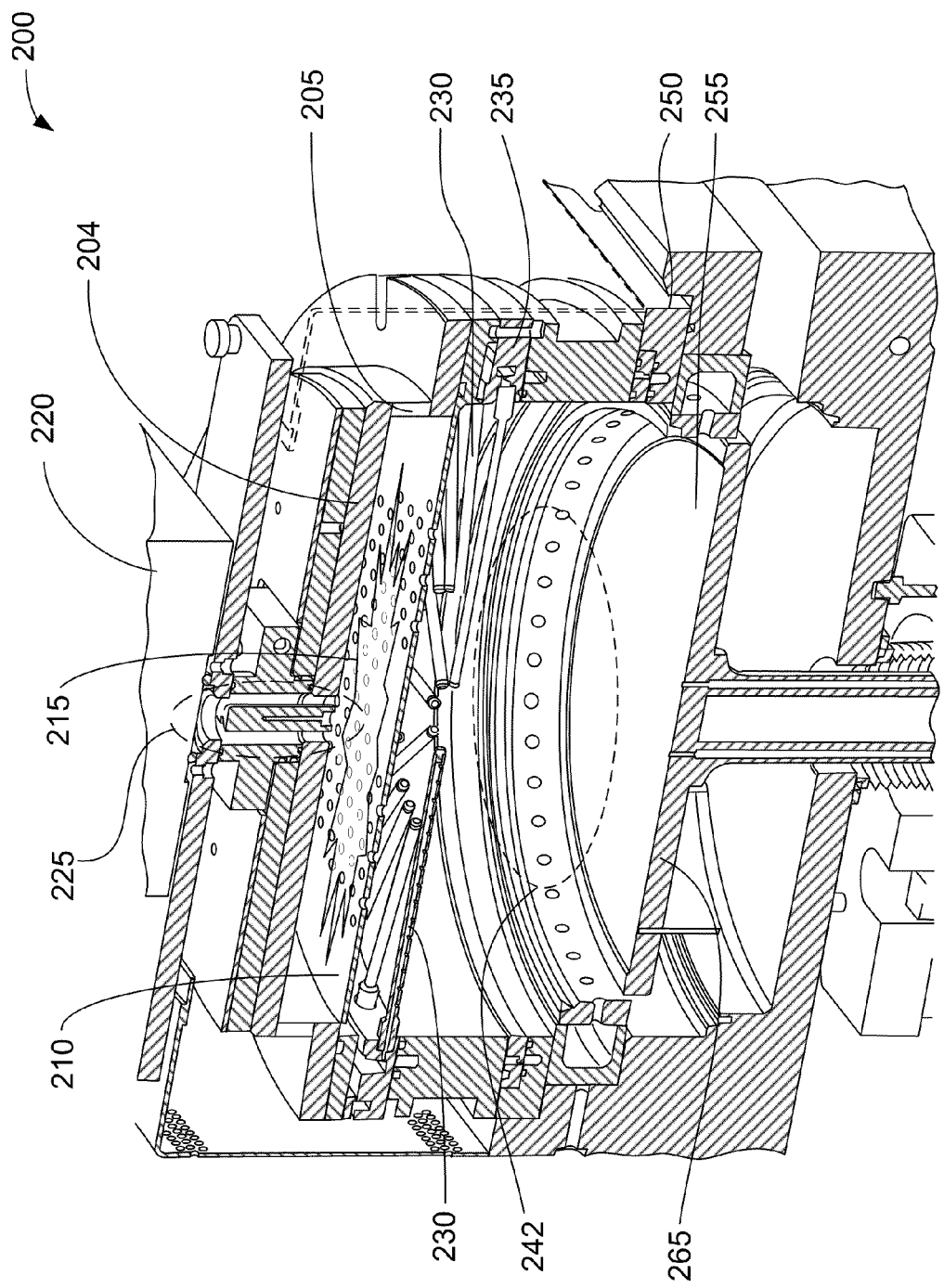
FIGS. 2A-2C are perspective views of multi-region process chambers for use with methods according to disclosed embodiments.
Figure 2B:
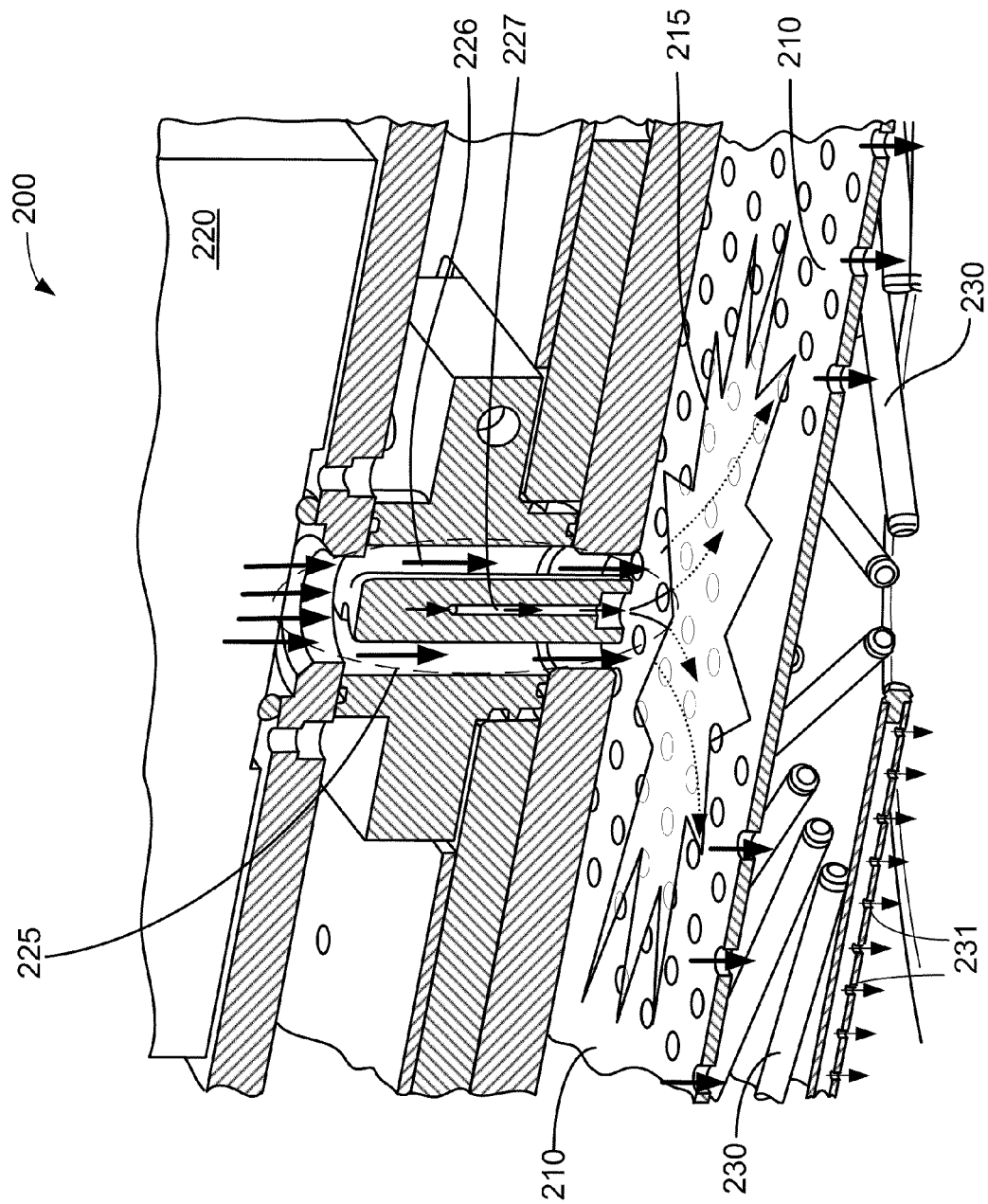
Figure 2C:
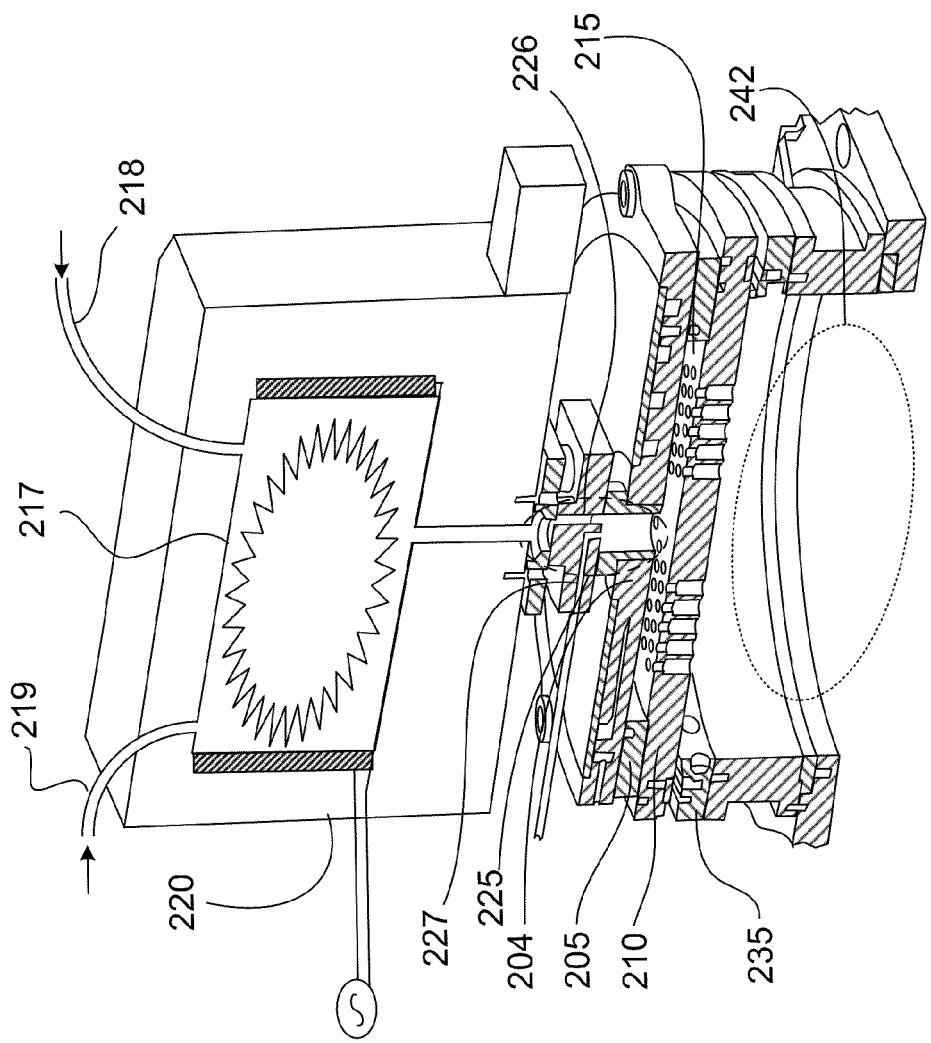

A brief introduction to the layout and use of aspects of an exemplary substrate processing chamber will prove helpful and precede a description of the protective treatment or seasoning methods. FIGS. 2A-2C are perspective views of multi-region process chambers for use with methods described herein. A process gas containing oxygen, hydrogen and/or nitrogen (e.g. oxygen ($O_2$), ozone ($O_3$), $N_2O$, NO, $NO_2$, $NH_3$, $N_xH_y$ including $N_2H_4$, silane, disilane, TSA, DSA, ...) may be introduced through the gas inlet assembly 225 into chamber plasma region 215. Chamber plasma region 215 may contain a plasma formed from the process gas. The process gas may also be excited prior to entering chamber plasma region 215 in a remote plasma region 217 within a remote plasma system (RPS) 220. In embodiments, an oxygen containing gas is excited within RPS 220 to form oxygen radicals (O) which pass through the annular portion of gas inlet assembly 225. Other channels are present in embodiments and allow other process precursors and gases to be introduced into process region 215 without passing through RPS 220.

Below chamber plasma region 215 is a showerhead 210, which is a perforated partition between chamber plasma region 215 and a substrate processing region 242. In embodiments, a plasma in chamber plasma region 215 is created by applying DC power or AC power of one or more frequencies (e.g. radio frequencies "RF") between lid 204 and showerhead 210, which may also be conductive. In order to enable the formation of a plasma in chamber plasma region 215, an electrically insulating ring 205 may be positioned between the lid 204 and showerhead 210 to enable an RF power to be applied between the lid 204 and showerhead 210. The plasmas may also be created inductively in which case the two plates are not necessarily conductive. Conductive coils may be embedded near or within walls (including the top) of the processing chamber surrounding the region. Other plasma generation methods may also be employed.

Figure 1:
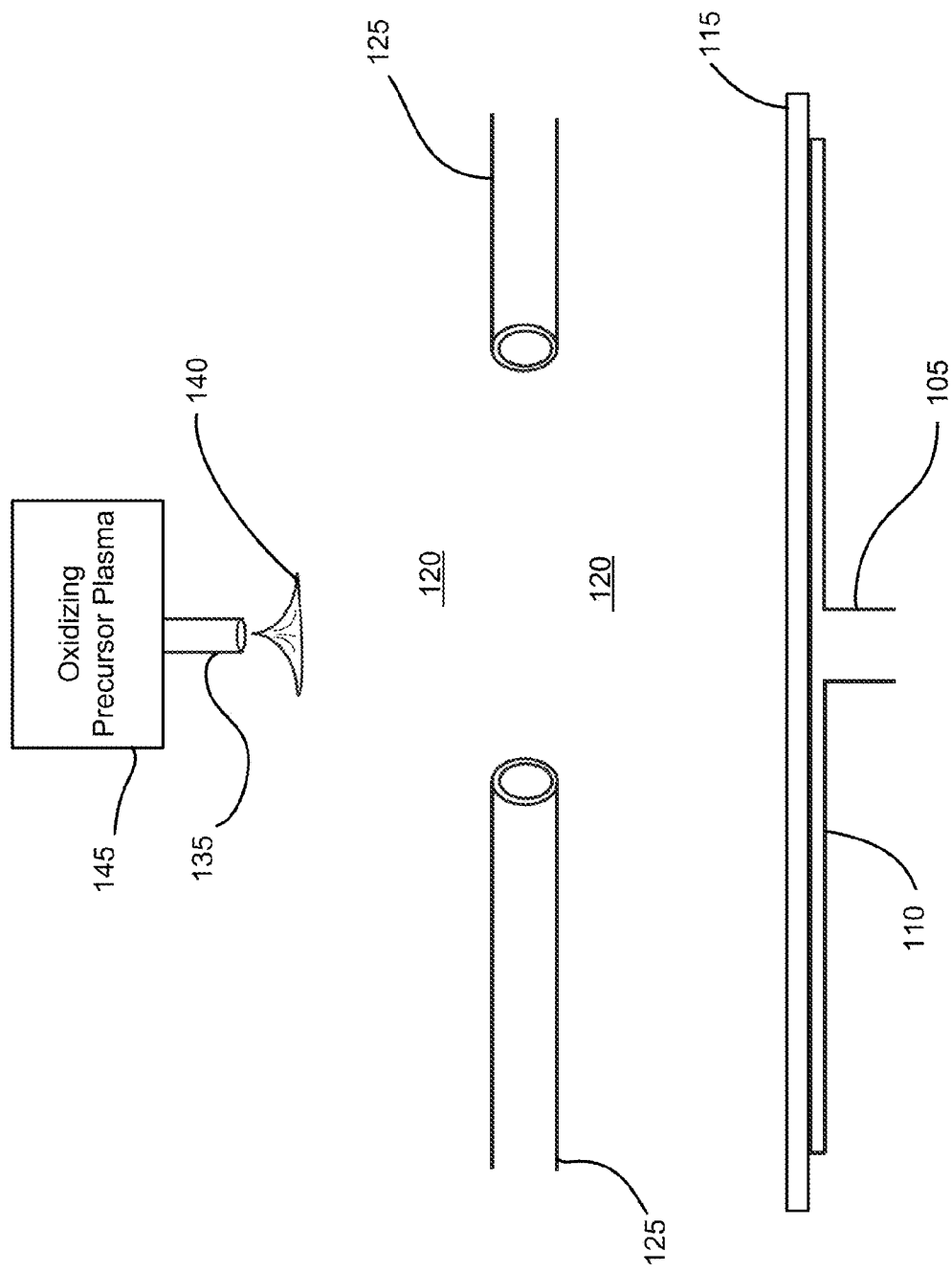
FIG. 1 is a schematic of a prior art processing region within a deposition chamber for growing films with separate oxidizing and organosilane precursors.

Substrate processing region 242 may receive excited gas from chamber plasma region 215 through holes in showerhead 210. Substrate processing region 242 may also receive gases and/or vapors from tubes 230 extending from a flange 235 of processing chamber 200. The gas traversing chamber plasma region 215 and the gas from tubes 230 are mixed in substrate processing region 242 to process the substrate 255. Igniting a plasma in chamber plasma region 215 to excite the process gas, may result in a more uniform distribution of excited species flowing into substrate processing region (substrate processing region 242) than a method relying only on RPS 145 and baffle 140 of FIG. 1. However, there is no plasma in substrate processing region 242 during the deposition in some embodiments.

A silicon-containing precursor may be flowed into substrate processing region 242 through tubes 230 extending from flange 235 of processing chamber 200. Excited species derived from the process gas travel through holes in showerhead 210 and react with the silicon-containing precursor flowing through substrate processing region 242. Effluents of the plasma created in chamber plasma region 215 and the silicon-containing precursor combine in the region above the substrate or on the substrate to form a flowable film on the substrate. As the film grows, more recently added material possesses a higher mobility than underlying material. Mobility decreases as organic content is reduced by evaporation. Gaps may be filled by the flowable film using this technique without leaving traditional densities of organic content within the film after deposition is completed. A curing step may still be used to further reduce or remove the organic content from a deposited film.

Processing the substrate 255 may include forming a film on the surface of the substrate 255 while the substrate is supported by a pedestal 265 positioned within substrate processing region 242. Flange 235 of processing chamber 200 may contain a gas distribution channel which distributes the gas to the tubes 230. With reference to FIG. 2B, silicon-containing precursors are delivered from the gas distribution channel through tubes 230. The precursors egress tubes 230 through an aperture at the end of each tube 230 and/or side apertures 231 along the length of the tubes 230. The end of tubes 230 may be closed to increase flow of precursors through side apertures 231.

Note that the path of the gas entering chamber plasma region 215 from the gas inlet 225 can be interrupted by a baffle (not shown, but analogous to the baffle 140 of FIG. 1) whose purpose here is to more evenly distribute the gas in chamber plasma region 215. In some disclosed embodiments, the process gas is an oxidizing precursor (e.g. containing oxygen ($O_2$), ozone ($O_3$), ...) which is excited within RPS 220 and/or chamber plasma region 215 to create oxygen radicals (O). Plasma effluents flow through the holes in showerhead 210 and combine with a silicon-containing precursor (e.g. silane, disilane, TSA, TMOS, DSA, TEOS, OMCTS, TMDSO, ...) introduced through tubes 230 into substrate processing region 242. The combination of reactants may be used to form a film of silicon oxide ($SiO_2$) on a substrate 255. In embodiments the process gas contains nitrogen ($NH_3$, $N_xH_y$ including $N_2H_4$, TSA, DSA, $N_2O$, NO, $NO_2$, ...) which, when combined with a silicon-containing precursor may be used to form silicon nitride, silicon oxynitride, silicon carbide, silicon oxycarbide or a porous low-K dielectric.

Exciting the process gas in chamber plasma region 215 alone or in combination with RPS 220 provides several benefits. The concentration of the excited species derived from the process gas may be increased within substrate processing region 242 due to the plasma in chamber plasma region 215. This increase may result from the location of the plasma in chamber plasma region 215. Substrate processing region 242 is located closer to chamber plasma region 215 than RPS 220, leaving less time for the excited species to leave excited states through collisions with other gas molecules, walls of the chamber and surfaces of showerhead 210.

The uniformity of the concentration of the excited species derived from the process gas may also be increased within substrate processing region 242. This may result from the shape of chamber plasma region 215, which is more similar to the shape of substrate processing region 242. Excited species created in RPS 220 travel greater distances in order to pass through holes near the edges of showerhead 210 relative to species that pass through holes near the center of showerhead 210. The greater distance results in a reduced excitation of the excited species and, for example, may result in a slower growth rate near the edge of a substrate. Exciting the process gas in chamber plasma region 215 mitigates this variation.

Despite these precautions, film growth rates and the uniformity of deposited films may degrade over time due, in part, to chamber cleaning procedures. Chamber cleaning procedures are conducted between deposition procedures to remove accumulating residue on the walls of a processing chamber. Chamber clean recipes often involve the introduction of fluorine-containing process gases and the formation of a cleaning plasma. The highly reactive plasma can modify surfaces and negatively impact later processes.

Many plasma regions like RPS 220 and chamber plasma region 215 may have anodization on aluminum interior walls to protect the walls from degradation. Cleaning plasmas can eventually remove the anodization to expose bare aluminum. Cleaning plasmas can also roughen the surface of the anodization and/or the bare aluminum The roughened surfaces and exposed underlying aluminum have been found to react with oxygen radicals (O) and convert the radicals to less reactive oxygen-containing species. The reduced concentration of oxygen radicals (O) reduces the growth rates of flowable films grown with flowable chemical vapor deposition (FCVD). The exposed surfaces of aluminum oxide and aluminum can also react with the oxygen radicals to create particulates which can relocate to the substrate during processing. Increased defectivity, lower growth rates and increased deposition nonuniformity can all reduce yields in a manufacturing process.

To address this problem, a film can be deposited on the interior surfaces of RPS 220 and chamber plasma region 215. Films which allow FCVD to maintain satisfactory growth rates and suitably low defectivity contain silicon and include films similar to those deposited on the substrate. These films include silicon oxide, silicon nitride, silicon oxynitride, silicon carbide, silicon oxycarbide and the like. Treatments of the interior walls of RPS 220 and chamber plasma region 215 can also include depositing a silicon layer. These treatments can be performed following each chamber cleaning procedure or a thicker layer can be deposited on the interior walls reducing the required frequency of the treatments.

A treatment gas is introduced into either RPS 220 and/or chamber plasma region 215 in order to deposit these protective films. FIG. 2B shows a close-up perspective view of gas inlet assembly 225, chamber plasma region 215 and RPS 220. Gas inlet assembly 225 is shown in finer detail revealing two distinct gas flow channels 226, 227. In an embodiment, the process gas is flowed into chamber plasma region 215 through an exterior channel 226. The process gas may not be excited by RPS 220. A treatment gas may flow into chamber plasma region 215 and RPS 220 through a variety of paths described herein. One possible path is through interior channel 227 which bypasses RPS 220. The pressure of the treatment gas builds up in chamber plasma region 215, RPS 220 and flows through showerhead 210 to populate processing region 242. Plasmas may then be initiated in RPS 220 and/or chamber plasma region 215 to deposit a silicon-containing film. The locations of the exterior channel 226 and the interior channel 227 may be arranged in a variety of physical configurations (e.g. the RPS excited gas may flow through the interior channel in disclosed embodiments) such that only one of the two channels flows through RPS 220.

FIG. 2C is a perspective view of a chamber-top assembly for use with a processing chamber according to disclosed embodiments. Several inlets 218, 219 may be available to introduce gases into RPS 220. A treatment inlet 218 may be used to introduce a treatment gas in order to deposit a silicon-containing film on interior walls of RPS 220 while an oxidizer inlet 219 may be used to introduce an oxidizing gas into RPS 220. A gas inlet assembly 225 introduces gas into chamber plasma region 215. Two distinct gas supply channels are visible within gas inlet assembly 225. Exterior channel 226 carries a gas that passes through RPS 220, while interior channel 227 bypasses RPS 220. Exterior channel 226 may be used for an oxidizer and interior channel 227 may be used for a silicon-containing gas during deposition and/or the treatments described herein. Lid 204 and showerhead 210 are shown with an insulating ring 205 in between, which allows the potential difference to be applied to lid 204 relative to showerhead 210. Flange 235 of substrate processing chamber 200 is shown with a gas distribution channel from which tubes may be mounted pointing radially inward. Tubes are not shown in FIG. 2C and a thicker design of showerhead 210 is depicted.

Treatments of the interior walls may involve the deposition of a silicon-containing layer on the interior walls of RPS 220 and chamber plasma region 215 by flowing a silicon-containing precursor into either plasma region or both at the same time while forming a plasma in the region requiring treatment. The silicon-containing precursor may include silane, disilane, TSA, TMOS, DSA, TEOS, OMCTS, TMDSO etc. Combinations of different silicon-containing precursors are also possible and the combinations may be referred to herein as a silicon-containing precursor for simplicity. A flow of silicon-containing precursor may be combined with a flow of an oxidizer in some embodiments. The silicon-containing precursor may be introduced through interior channel 227 or treatment inlet 218 as already indicated.

Alternative introduction means for the silicon-containing precursor include through oxidizer inlet 219 or into processing region 242 (possibly but not necessarily through tubes 230). Introducing the silicon-containing precursor into processing region 242 raises the pressure in processing region 242 after which the precursor flows through showerhead 210 into chamber plasma region 215 and into RPS 220 in embodiments. The chamber vacuum pump may be off while filling the regions described with the silicon-containing precursor. The pressure in the plasma region of interest (RPS 220 and/or chamber plasma region 215) may rise and possibly stagnate before the flow of silicon-containing precursor. The plasma(s) may then be initiated. The pressures in the plasma regions of interest may be below or about 100 Torr, below or about 50 Torr, below or about 20 Torr, below or about 10 Torr or below or about 5 Torr. The pressures in the plasma regions of interest may be above or about 0.5 Torr, above or about 1 Torr, above or about 2 Torr, above or about 5 Torr in different embodiments. Each of the lower bounds may be combined with any of the upper bounds on the pressures to form additional ranges of suitable pressures according to disclosed embodiments.

Alternatively, and regardless of entry port, the flow of silicon-containing precursor may remain during the treatment plasma. Though a valve between substrate processing region 242 may be throttled (partially closed) in order to allow the pressure within one or more of the plasma regions of interest to achieve a pressure high enough to allow appreciable deposition of a silicon-containing film on interior walls.

Figure 3:
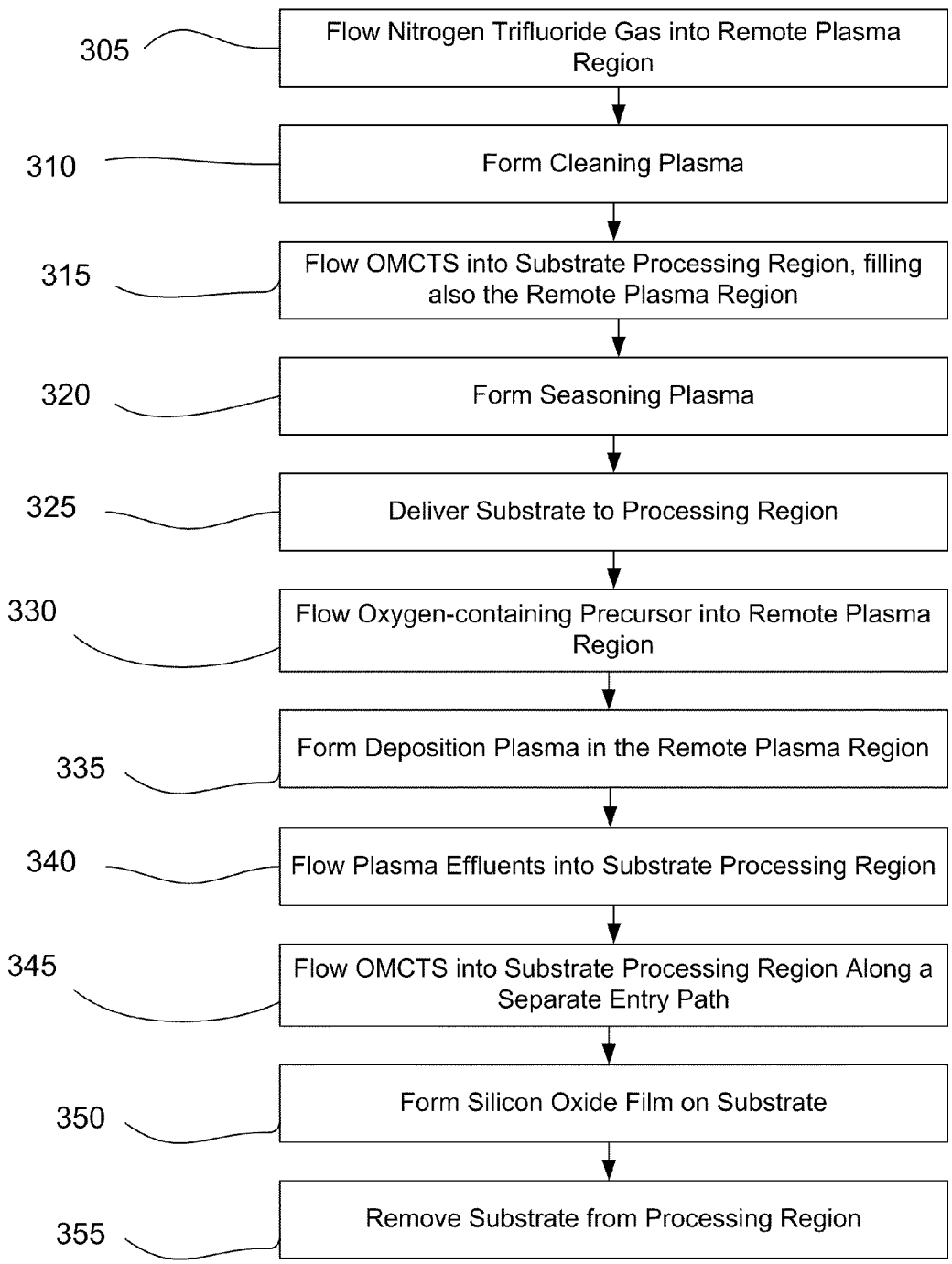
FIG. 3 is a flow chart of a deposition process according to disclosed embodiments.
Figure 4:
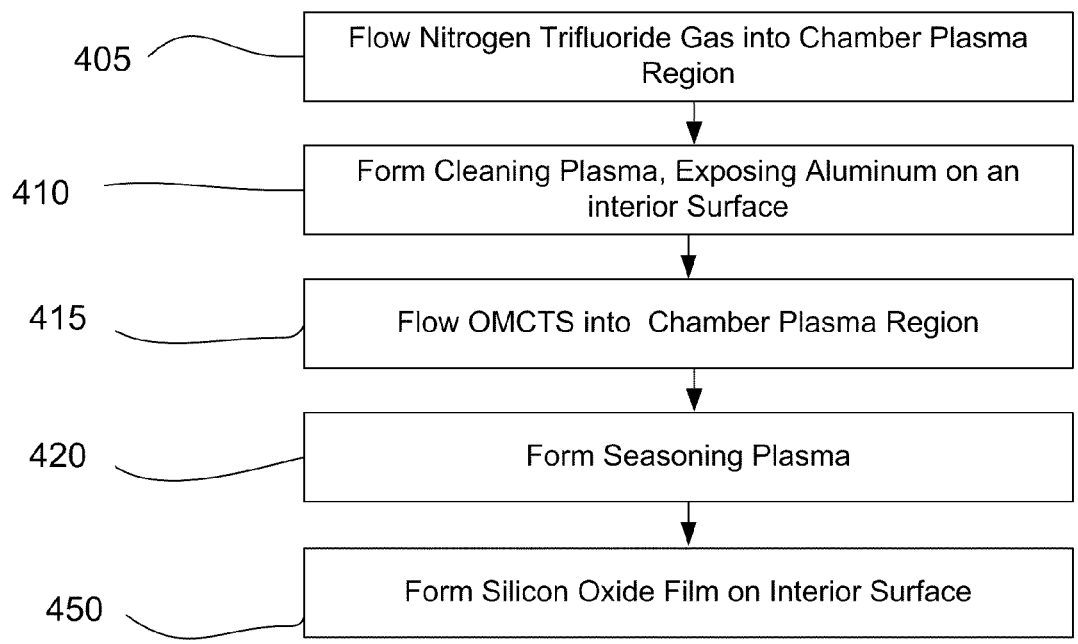
FIG. 4 is a flow chart of a deposition process according to disclosed embodiments.

In order to better understand and appreciate the invention, reference is now made to FIGS. 3 & 4, which are flow charts of remote plasma region seasoning processes according to disclosed embodiments.

The process shown in FIG. 3 begins with a flow of nitrogen trifluoride into a remote plasma region (operation 305). A plasma is formed (operation 310) in the remote plasma region to clean interior walls of the region. OMCTS is flowed into the substrate processing region (operation 315) and passes through a showerhead, filling first a chamber plasma region and then a remote plasma region. Another plasma is formed (operation 320) in the remote plasma region to season the interior walls of the region, forming a protective layer containing silicon and oxygen. In embodiments, no plasma is present in the substrate processing region during seasoning.

A substrate is then delivered (operation 325) into the substrate processing region. An oxidizer is flowed into the remote plasma region in operation 330 and a deposition plasma is started (operation 335) to form plasma effluents including oxygen radicals (O). The plasma effluents are then flowed (operation 340) into a substrate processing region where they react with a flow of OMCTS (operation 345). A silicon oxide film is formed on the substrate in operation 350 and the substrate is removed from the processing region in operation 355.

FIG. 4 is a flow chart of a seasoning process according to disclosed embodiments. The process begins when a flow of nitrogen trifluoride is initiated (operation 405) into a chamber plasma region separated from a substrate processing region. A cleaning plasma is initiated in the chamber plasma region (operation 410) to remove process debris deposited during previous substrate processing procedures. Operation 410 also removes material from the chamber walls exposing aluminum in a protective anodization and/or in the chamber walls themselves.

A flow of OMCTS is initiated into the chamber plasma region (operation 415) and a seasoning plasma is started (operation 420). A silicon oxide film is deposited on the exposed aluminum (operation 450) to suppress reaction of plasma effluents with the interior walls during subsequent deposition steps. During the deposition, there is no plasma in the substrate processing region in embodiments. The flow of OMCTS may not be directly into the chamber plasma region; OMCTS may instead flow directly into the substrate processing region and through a showerhead into the chamber plasma region in embodiments.

Exemplary Substrate Processing System

Figure 5:
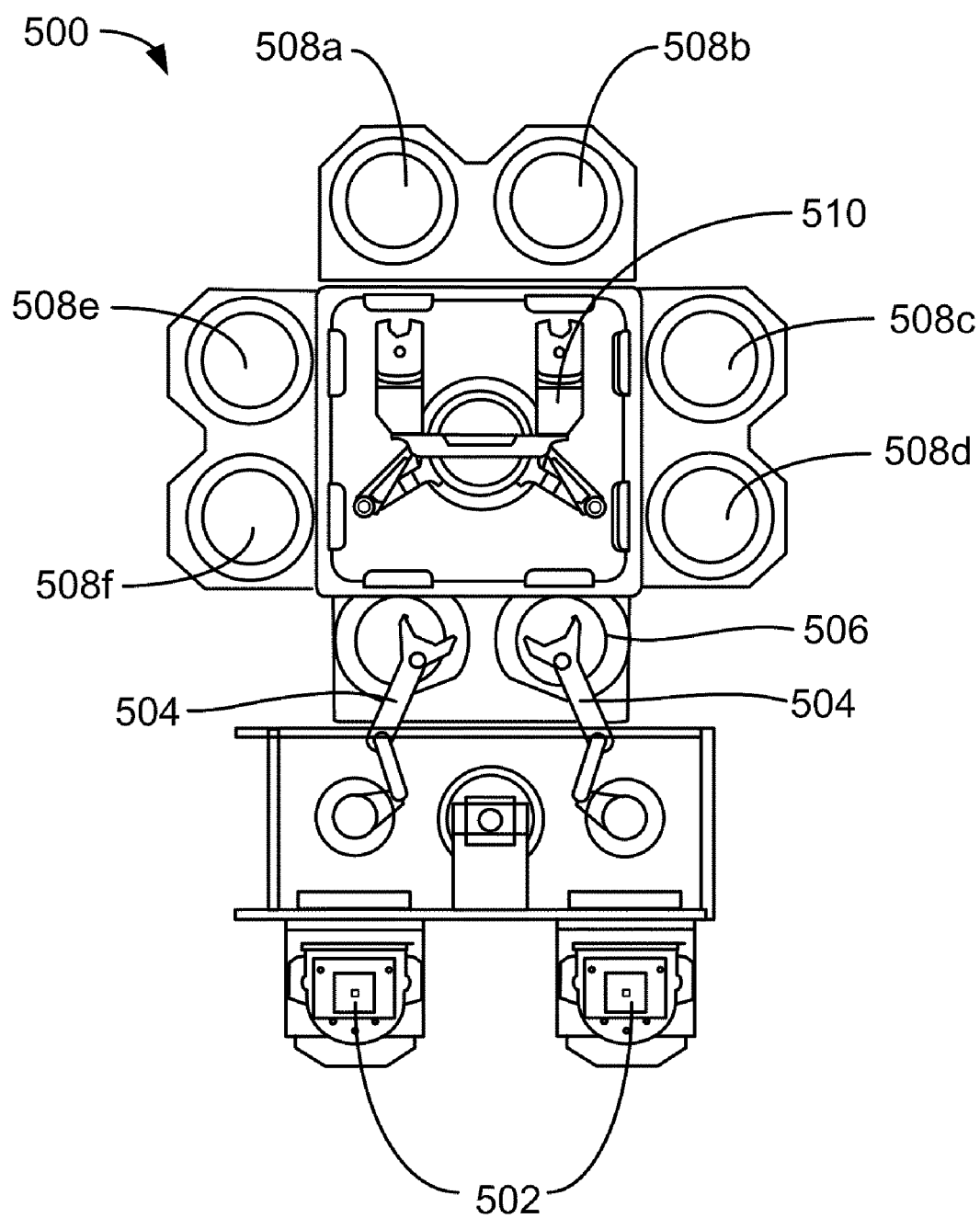
FIG. 5 is a substrate processing system according to disclosed embodiments.

Embodiments of the deposition systems may be incorporated into larger fabrication systems for producing integrated circuit chips. FIG. 5 shows one such system 500 of deposition, baking and curing chambers according to disclosed embodiments. In the figure, a pair of FOUPs (front opening unified pods) 502 supply substrate substrates (e.g., 300 mm diameter wafers) that are received by robotic arms 504 and placed into a low pressure holding area 506 before being placed into one of the wafer processing chambers 508a-f. A second robotic arm 510 may be used to transport the substrate wafers from the holding area 506 to the processing chambers 508a-f and back.

The processing chambers 508a-f may include one or more system components for depositing, annealing, curing and/or etching a flowable dielectric film on the substrate wafer. In one configuration, two pairs of the processing chamber (e.g., 508c-d and 508e-f) may be used to deposit the flowable dielectric material on the substrate, and the third pair of processing chambers (e.g., 508a-b) may be used to anneal the deposited dielectic. In another configuration, the same two pairs of processing chambers (e.g., 508c-d and 508e-f) may be configured to both deposit and anneal a flowable dielectric film on the substrate, while the third pair of chambers (e.g., 508a-b) may be used for UV or E-beam curing of the deposited film. In still another configuration, all three pairs of chambers (e.g., 508a-f) may be configured to deposit an cure a flowable dielectric film on the substrate. In yet another configuration, two pairs of processing chambers (e.g., 508c-d and 508e-f) may be used for both deposition and UV or E-beam curing of the flowable dielectric, while a third pair of processing chambers (e.g. 508a-b) may be used for annealing the dielectric film. It will be appreciated, that additional configurations of deposition, annealing and curing chambers for flowable dielectric films are contemplated by system 500.

In addition, one or more of the process chambers 508a-f may be configured as a wet treatment chamber. These process chambers include heating the flowable dielectric film in an atmosphere that include moisture. Thus, embodiments of system 500 may include wet treatment chambers 508a-b and anneal processing chambers 508c-d to perform both wet and dry anneals on the deposited dielectric film.

Figure 6:
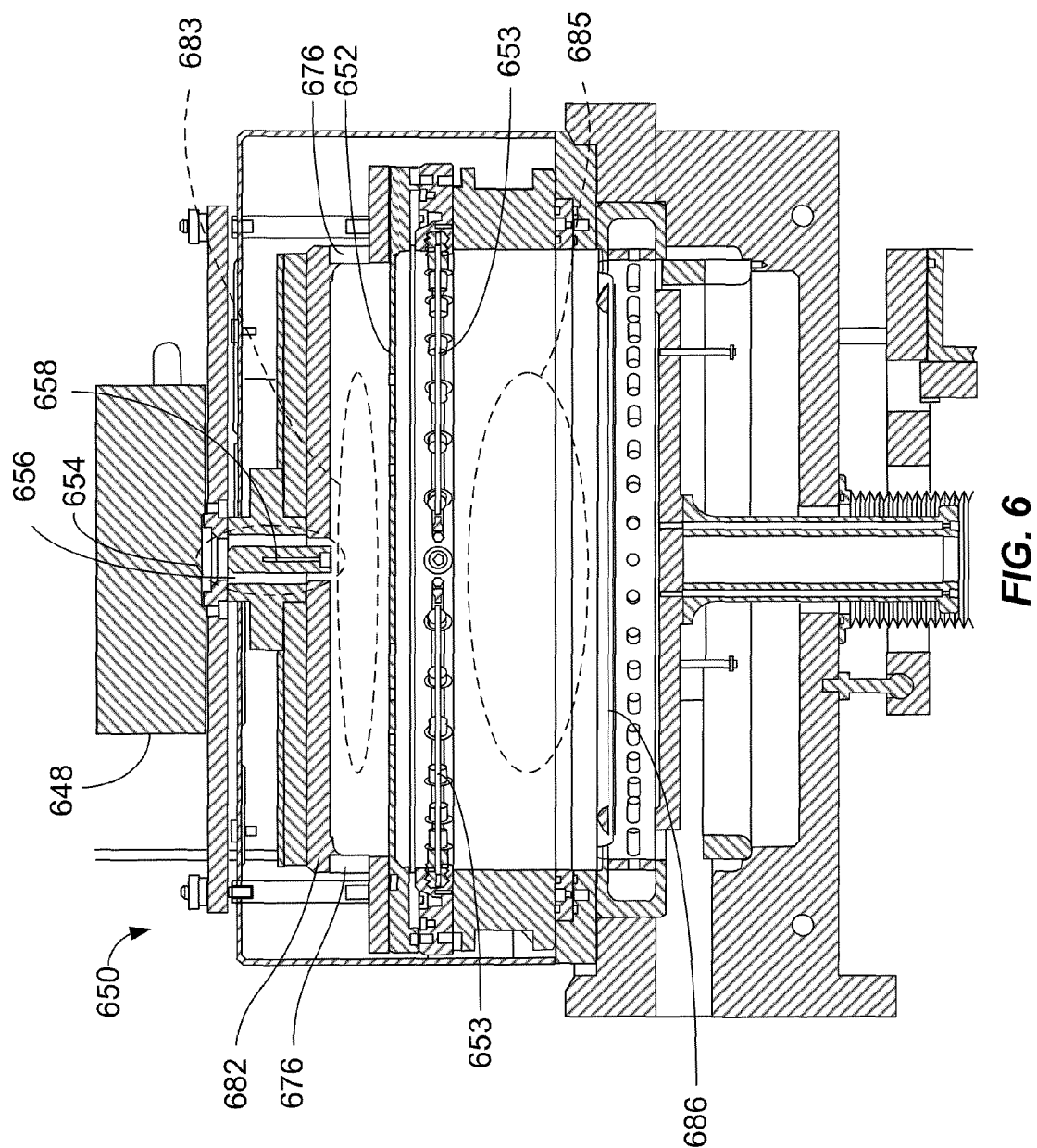
FIG. 6 is a substrate processing chamber according to disclosed embodiments.

FIG. 6 is a substrate processing chamber 650 according to disclosed embodiments. A remote plasma system (RPS) 648 may process a gas which then travels through a gas inlet assembly 654. More specifically, the gas travels through channel 656 into chamber plasma region 683. Below chamber plasma region 683 is a perforated partition (a showerhead) 652 to maintain some physical separation between chamber plasma region 683 and a substrate processing region 685 beneath showerhead 652. Showerhead 652 allows a plasma present in chamber plasma region 683 to avoid directly exciting gases in substrate processing region 685, while still allowing excited species to travel from chamber plasma region 683 into substrate processing region 685.

Showerhead 652 is positioned above side nozzles (or tubes) 653 protruding radially into the interior of substrate processing region 685 of the substrate processing chamber 650. Showerhead 652 distributes the precursors through a plurality of holes that traverse the thickness of the plate. Showerhead 652 may have, for example from about 10 to 10000 holes (e.g., 200 holes). In the embodiment shown, showerhead 652 may distribute a process gas which contains oxygen, hydrogen and/or nitrogen or derivatives of such process gases upon excitation by a plasma in chamber plasma region 683. In embodiments, the process gas may contain one or more of oxygen ($O_2$), ozone ($O_3$), $N_2O$, NO, $NO_2$, $NH_3$, $N_xH_y$ including $N_2H_4$, silane, disilane, TSA and DSA.

The tubes 653 may have holes in the end (closest to the center of substrate processing region 685) and/or holes distributed around or along the length of the tubes 653. The holes may be used to introduce a silicon-containing precursor into substrate processing region 685. A film is created on a substrate supported by a pedestal 686 in substrate processing region 685 when the process gas and its excited derivatives arriving through the holes in showerhead 652 combine with the silicon-containing precursor arriving through the tubes 653.

The top inlet 654 may have two or more independent precursor (e.g., gas) flow channels 656 and 658 that keep two or more precursors from mixing and reaction until they enter chamber plasma region 683 above showerhead 652. The first flow channel 656 may have an annular shape that surrounds the center of inlet 654. This channel may be coupled to the remote plasma system (RPS) 648 that generates a reactive species precursor which flows down the channel 656 and into chamber plasma region 683 above showerhead 652. The second flow channel 658 may be cylindrically shaped and may be used to flow a second precursor to chamber plasma region 683. This flow channel may start with a precursor and/or carrier gas source that bypasses a reactive species generating unit. The first and second precursors are then mixed and flow through the holes in the plate 652 to substrate processing region 685.

Showerhead 652 and top inlet 654 may be used to deliver the process gas to substrate processing region 685 in the substrate processing chamber 650. For example, first flow channel 656 may deliver a process gas that includes one or more of atomic oxygen (in either a ground or electronically excited state), oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 658 may also deliver a process gas, a carrier gas, and/or a film-curing gas used to remove an unwanted component from the growing or as-deposited film.

For a capacitively coupled plasma (CCP), an electrical insulator 676 (e.g. a ceramic ring) is placed between showerhead 652 and the conductive top portion 682 of the processing chamber to enable an voltage difference to be asserted. The presence of the electrical insulator 676 ensures that a plasma may be created by the RF power source inside chamber plasma region 683. Similarly, a ceramic ring may also be placed between showerhead 652 and the pedestal 686 (not shown in FIG. 6) to allow a plasma to be created in substrate processing region 685. This may be placed above or below the tubes 653 depending on the vertical location of the tubes 653 and whether they have metal content which could result in sparking.

A plasma may be ignited either in chamber plasma region 683 above showerhead 652 or substrate processing region 685 below showerhead 652 and the side nozzles 653. An AC voltage typically in the radio frequency (RF) range is applied between the conductive top portion 682 of the processing chamber and showerhead 652 to ignite a plasma in chamber plasma region 683 during deposition. The top plasma is left at low or no power when the bottom plasma 685 is turned on to either cure a film or clean the interior surfaces bordering substrate processing region 685. A plasma in substrate processing region 685 is ignited by applying an AC voltage between showerhead 652 and the pedestal 686 (or bottom of the chamber).

In addition to the process gas and silicon-containing precursor there may be other gases introduced at varied times for varied purposes. A cleaning gas may be introduced into chamber plasma region 683 while forming a plasma to remove debris from exposed surfaces. A seasoning or silicon-containing precursor may be introduced (as described in the Specification and FIGS. 3 and 4, for example) to plasma region 683 to deposit a silicon-containing layer on the exposed surfaces of chamber plasma region 683. No plasma is present in substrate processing region 685 during seasoning in embodiments.

A gas in an "excited state" as used herein describes a gas wherein at least some of the gas molecules are in vibrationally-excited, dissociated and/or ionized states. A gas may be a combination of two or more gases.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon-containing layer on a surface of a substrate within a processing region, the method comprising:
    cleaning an interior surface of a remote plasma region, wherein the cleaning operation comprises:
        flowing a cleaning gas into the remote plasma region, and
        forming a cleaning plasma in the remote plasma region; and
    treating the interior surface, wherein the treating operation comprises:
        flowing a first silicon-containing precursor into the remote plasma region, and
        forming a treatment plasma in the remote plasma region to deposit a protective silicon-containing film on the interior surface.

2. The method of claim 1 further comprising:
    depositing the silicon-containing layer on the substrate, wherein the depositing operation comprises:
        flowing an oxygen-containing precursor into the remote plasma region,
        forming a deposition plasma in the remote plasma region, flowing deposition plasma effluents into the processing region, flowing a second silicon-containing precursor into the processing region, and forming the silicon-containing layer from the deposition plasma effluents and the second silicon-containing precursor.

3. The method of claim 2, wherein the first silicon-containing precursor is the same as the second silicon-containing precursor.

4. The method of claim 2, wherein the deposition plasma effluents comprise oxygen radicals (O).

5. The method of claim 1, wherein the silicon-containing layer comprises silicon oxide.

6. The method of claim 1, wherein the first silicon-containing precursor is a silicon-and-oxygen-containing precursor.

7. The method of claim 1, wherein the silicon-containing precursor comprises at least one of silane, disilane, TSA, TMOS, DSA, TEOS, OMCTS and TMDSO.

8. The method of claim 1, wherein the cleaning gas comprises fluorine.

9. The method of claim 1, wherein the cleaning gas comprises nitrogen trifluoride ($NF_3$).

10. The method of claim 1, wherein the first silicon-containing precursor flows into the processing chamber before flowing into the remote plasma region.

11. The method of claim 1, wherein the presence of the treating operation reduces a number of added particles during the depositing operation.

12. The method of claim 1, wherein the presence of the treating operation increases a deposition rate during the depositing operation.

13. The method of claim 1, wherein a pressure in the remote plasma region is between about 2 Torr and about 10 Torr.

14. The method of claim 1, wherein the operation of flowing a first silicon-containing precursor is completed before the operation of forming a treatment plasma and a valve between the processing region and a vacuum pump is closed during the operation of forming a treatment plasma.

15. A method of treating an aluminum-containing interior surface of a remote plasma source prior to depositing a silicon-containing layer on a substrate within a processing region, the method comprising:

flowing a halogen-containing gas into the remote plasma region;

forming a cleaning plasma in the remote plasma region which results in exposed portions of the aluminum-containing interior surface;

flowing a first silicon-containing precursor into the remote plasma region; and forming a treatment plasma in the remote plasma region to deposit a silicon-containing film on the aluminum-containing interior surface.

16. The method of claim 15 further comprising:

depositing the silicon-containing layer on the substrate, wherein the depositing operation comprises:

flowing an oxygen-containing precursor into the remote plasma region, forming a deposition plasma in the remote plasma region, flowing deposition plasma effluents into the processing chamber, flowing a second silicon-containing precursor into the processing chamber, and forming the silicon-containing layer from the deposition plasma effluents and the second silicon-containing precursor.

17. The method of claim 15, wherein the halogen-containing gas comprises nitrogen trifluoride ($NF_3$).

18. The method of claim 15, wherein the silicon-containing film is predominantly silicon.

19. The method of claim 15, wherein the silicon-containing film comprises silicon oxide.

20. A method of forming a silicon oxide layer on the surface of a substrate within a processing region, the method comprising:

cleaning an interior surface of a plasma region, wherein the cleaning operation comprises:

flowing a cleaning gas into the plasma region, and forming a cleaning plasma in the plasma region;

seasoning the interior surface of the plasma region, wherein the seasoning operation comprises:

flowing a first silicon-containing precursor into the plasma region, and forming a seasoning plasma in the plasma region to deposit a protective silicon-containing film on the interior surface; and depositing the silicon oxide layer on the substrate, wherein the depositing operation comprises:

flowing an oxygen-containing precursor into the plasma region, forming a deposition plasma in the plasma region, flowing deposition plasma effluents into the processing region, flowing a second silicon-containing precursor into the processing region, and forming the silicon oxide film from the deposition plasma effluents and the second silicon-containing precursor.

21. The method of claim 20, wherein the plasma region is a remote plasma region.

22. The method of claim 20, wherein the plasma region is within the processing chamber but separated from the processing region by a showerhead.

23. The method of claim 20, wherein the first silicon-containing precursor is the same as the second silicon-containing precursor.

* * * * *